US011719391B2

(12) United States Patent
Petter et al.

(10) Patent No.: US 11,719,391 B2
(45) Date of Patent: Aug. 8, 2023

(54) CIRCUIT BOARD FOR LED RETROFIT LAMP

(71) Applicant: LUMILEDS LLC, San Jose, CA (US)

(72) Inventors: Markus Petter, Roetgen (DE); Jürgen Mertens, Wuerselen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/751,299

(22) Filed: May 23, 2022

(65) Prior Publication Data
US 2022/0397242 A1 Dec. 15, 2022

Related U.S. Application Data

(60) Provisional application No. 63/191,698, filed on May 21, 2021.

(51) Int. Cl.
F21K 9/23 (2016.01)
(52) U.S. Cl.
CPC ..................................... F21K 9/23 (2016.08)
(58) Field of Classification Search
None
See application file for complete search history.

(56) References Cited

U.S. PATENT DOCUMENTS

| 11,415,283 B2 | 8/2022 | Kessels et al. |
| 2015/0117037 A1 | 4/2015 | Fan |
| 2016/0273751 A1 | 9/2016 | Xiao et al. |
| 2019/0211991 A1* | 7/2019 | Lessard ................... F21S 45/49 |
| 2020/0292138 A1 | 9/2020 | Crayford et al. |

FOREIGN PATENT DOCUMENTS

| EP | 3951252 | 2/2022 |
| WO | 2011/078217 A1 | 6/2011 |
| WO | 2015/169642 A1 | 11/2015 |
| WO | 2018/125595 A1 | 7/2018 |
| WO | 2022/010890 | 1/2022 |
| WO | 2022/011280 | 1/2022 |

OTHER PUBLICATIONS

International Search Report and Written Opinion dated Sep. 9, 2022 for PCT International Application No. PCT/US2022/030528.

* cited by examiner

Primary Examiner — Elmito Breval
(74) Attorney, Agent, or Firm — Volpe Koenig

(57) ABSTRACT

A circuit board, a light-emitting diode (LED) retrofit lamp for use with the circuit board and a method of manufacturing an LED retrofit lamp are described herein. A circuit board includes a body part and two longitudinal fingers symmetrically extending from the body part in a longitudinal direction of the LED retrofit lamp.

16 Claims, 12 Drawing Sheets

CIRCUIT BOARD FOR LED RETROFIT LAMP

CROSS REFERENCE TO RELATED APPLICATIONS

This application claims the benefit of U.S. Provisional Patent Application No. 63/191,698, which was filed on May 21, 2021, the contents of which are hereby incorporated by reference herein.

BACKGROUND

Light emitting diodes (LEDs) are more and more replacing older technology light sources, such as halogen lamps, gas-discharge lamps, and Xenon, lamps (also referred to collectively as conventional lamps), due to superior technical properties, such as energy efficiency and lifetime. This may also be true for demanding applications, such as in terms of luminance, luminosity, and/or beam shaping (e.g., vehicle headlighting). Considering the vast installation base of conventional lamps, LED retrofit lamps or LED retrofits for short may more or less replacing conventional lamps while allowing continued use of other system components, such as optics (e.g., reflectors and/or lenses) and luminaires, may be of great economic interest.

SUMMARY

A circuit board, a light-emitting diode (LED) retrofit lamp for use with the circuit board and a method of manufacturing an LED retrofit lamp are described herein. A circuit board includes a body part and two longitudinal fingers symmetrically extending from the body part in a longitudinal direction of the LED retrofit lamp.

BRIEF DESCRIPTION OF THE DRAWINGS

A more detailed understanding can be had from the following description, given by way of example in conjunction with the accompanying drawings wherein.

DETAILED DESCRIPTION

Figure 1A:
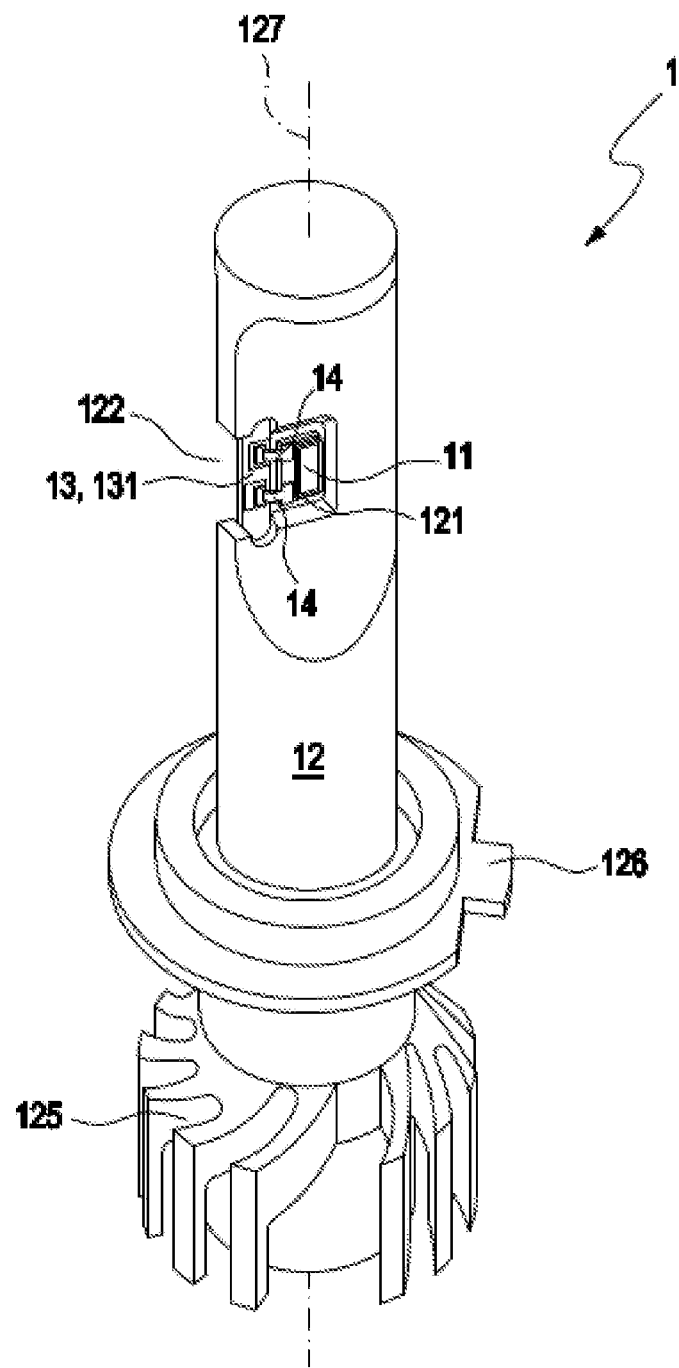
FIG. 1a is a schematic perspective view of an LED retrofit lamp and some of its components.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

In manufacturing an LED retrofit providing a fully functional replacement for a conventional lamp, many restraints are placed on the design, including not only general light technical requirements but also constraints due to the continued use of the other system components. Besides light technical data, such as luminance and angular light distribution, mechanical boundary conditions as to size and shape may also arise as the LED retrofit must fit into the same installation space as the conventional lamp it replaces.

Figure 1B:
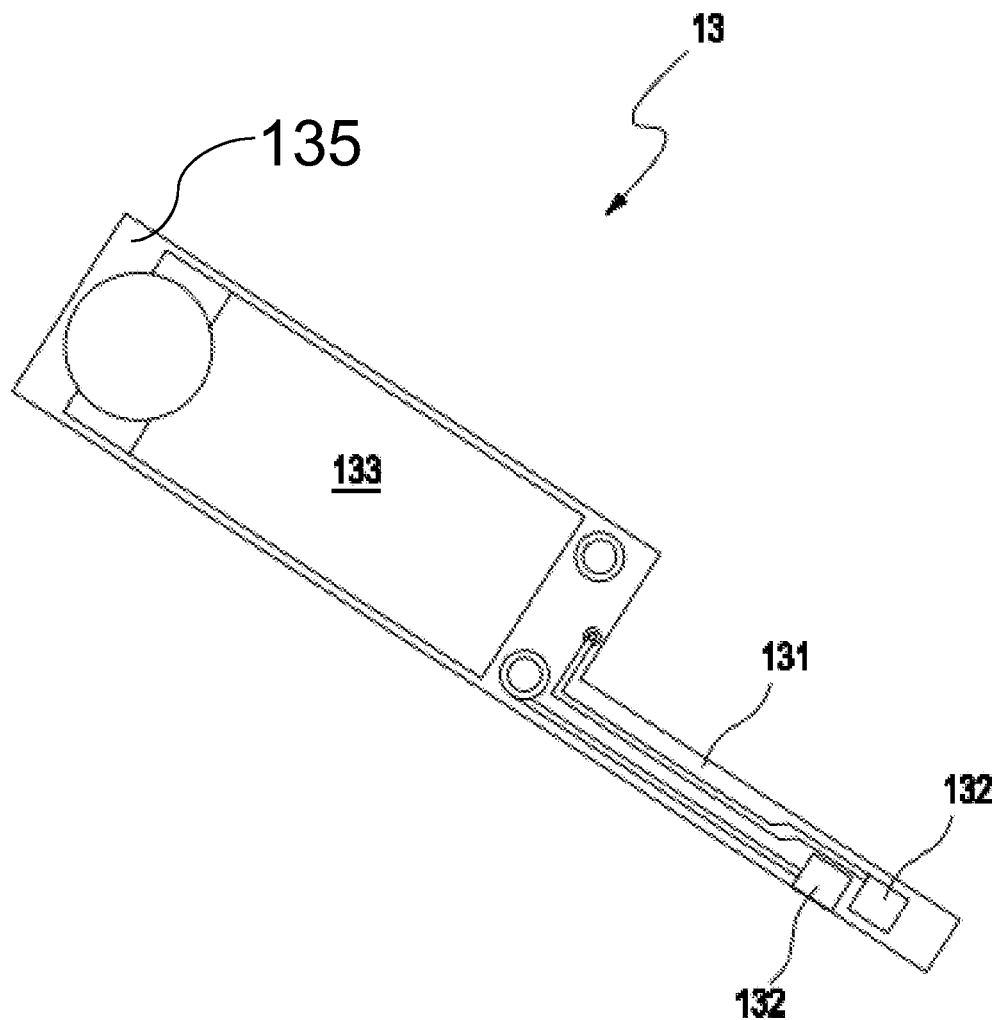
FIG. 1b is a top view of the LED retrofit lamp of FIG. 1a and some of its components.
Figure 1C:
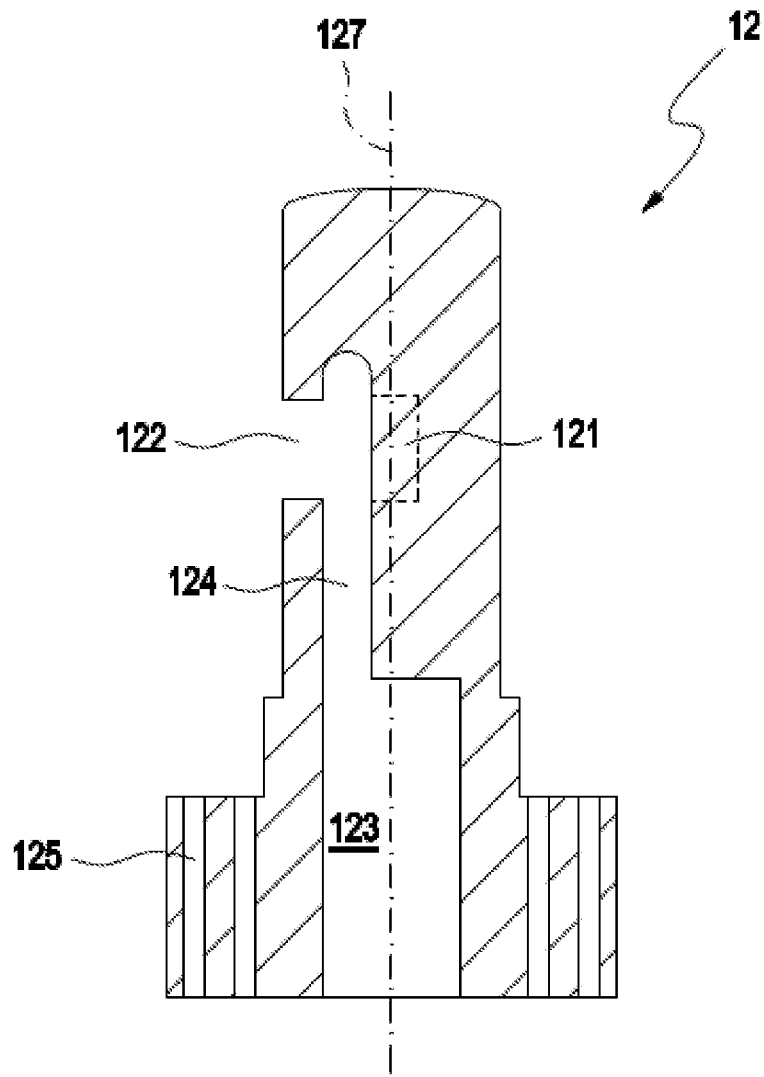
FIG. 1c is a cross-sectional view of the LED retrofit lamp of FIG. 1a and some of its components.

FIG. 1 includes three drawings showing different views of an LED retrofit lamp and some of its components. FIG. 1a shows the LED retrofit lamp and some of its components in schematic perspective view, FIG. 1b shows the LED retrofit lamp and some of its components in top view, and FIG. 1c shows the LED retrofit lamp and some of its components in cross-sectional view. Similar drawings can be found in unpublished European patent application with application no. EP20189392.2 of the same applicant, which document is hereby incorporated by reference herein.

In the example illustrated in FIG. 1, the LED retrofit lamp 1, like the conventional halogen lamp it replaces, has a longitudinal shape with longitudinal direction 127 with heat fins 125 at its bottom or base side. The LED retrofit lamp 1 may also include a flange or centering ring 126 above the fins 125, followed by the longitudinal lamp body 12 in the lamp's upper part. The light (in operation of the lamp) may emanate from an LED module 11 mounted on a support portion 121. The LED module 11 may receive its electrical power via ribbon bonds 14 connected to corresponding contact pads on a finger-like portion 131 (finger) of a circuit board 13, which may all be located in lateral opening 122 of the lamp body 12.

FIG. 1(b) shows the overall planar longitudinal shape of the example circuit board 13 with its body part 135 on the left side of the figure carrying a driver circuit 133 for the LED module 11. On the right side, the finger 131 may extend from the body part 135 and carry the contact pads 132 to which ribbon bonds 14 of FIG. 1(a) may be connected.

In the cross-sectional view of FIG. 1(c) of lamp body 12, besides the already discussed heat fins 125, lateral opening 122 and support portion 121, the lamp body 12 may also include a bore 123 with duct part 124 into which, on assembly, circuit board 13 may be inserted, with finger 131 of circuit board 13 being inserted into duct 124.

There may, however, be reliability issues with construction of the LED retrofit lamp of FIG. 1. For example, to obtain a reliable connection of ribbon bonds 14 to contact pads 132 on finger 131, the part of finger 131 exposed by lateral opening 122 of lamp body 12 needs to be safely held in position to withstand the mechanical forces on ribbon bonding. Such fixation, however, may only be obtained by a firm clamping of the not exposed parts of finger 131 in duct 124. For example, duct 124 may be realized by making the upper part of lamp body 12 a two-part component.

Figure 2:
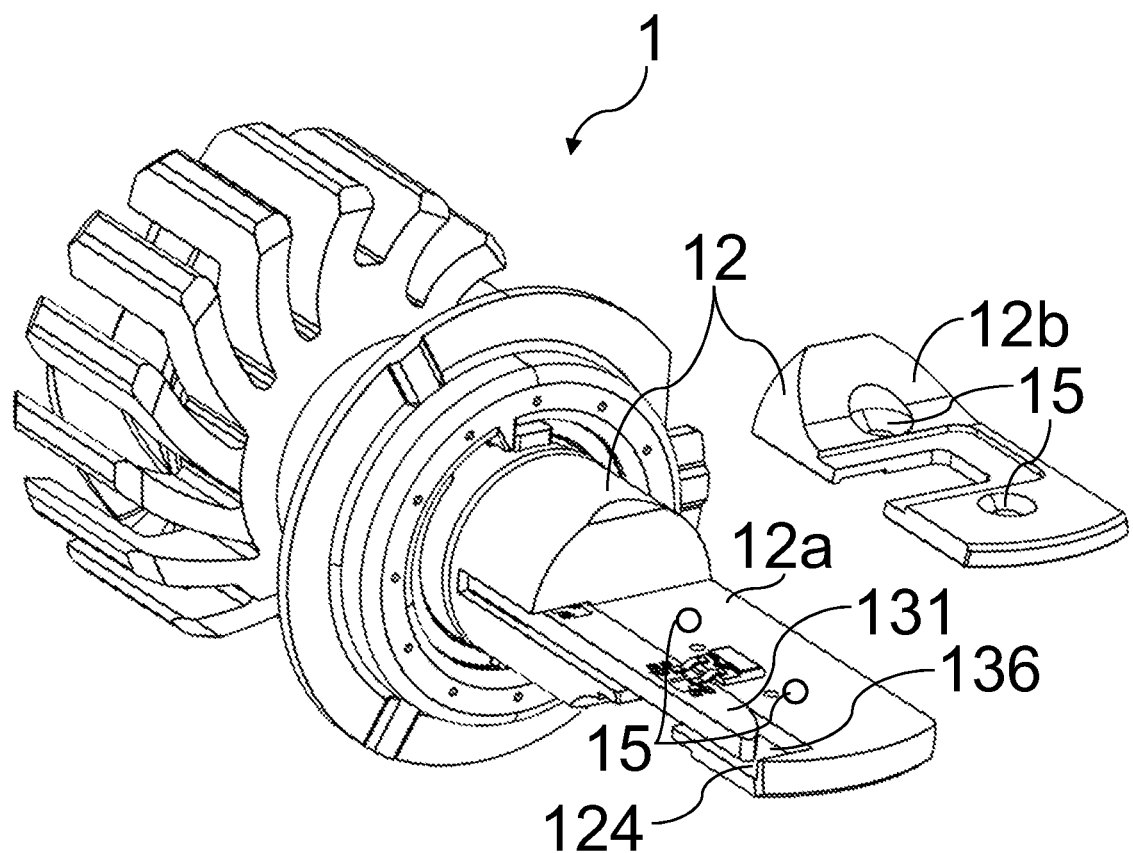
FIG. 2 is a schematic perspective view of the LED retrofit lamp of FIG. 1a mounted to a two-part lamp body that has been partially disassembled.

FIG. 2 is a schematic perspective view of the LED retrofit lamp of FIG. 1a mounted to a two-part lamp body that has been partially disassembled. Duct 124 may be realized as a recess 136 in the lower part 12a of lamp body 12, into which finger 131 of circuit board 13 may be inserted from the base side of the LED retrofit 1. The upper part 12b of the lamp body 12 can then be fixed to the lower part 12a, for example by screwing (see screw holes 15), thereby acting as a clamping plate for finger 131.

In an ideal situation, the finger 131 may have the exact thickness of the duct 124 and may be exactly planar as would be the surface of recess 136 and the lower surface of clamping plate 12b, thereby leading to an exact planar contact area between the finger 131 and the surfaces of the duct 124, with such exactly planar contact avoiding any critical stress build-up within the finger 131 in the duct 124. However, production tolerances, in particular in a cost-effective manufacturing setup, may prevent achieving such ideal conditions. Instead, practically occurring thickness differences of finger 131 and duct 124 may lead to point or line contacts only which may compromise the integrity of the finger 131.

Figure 3A:
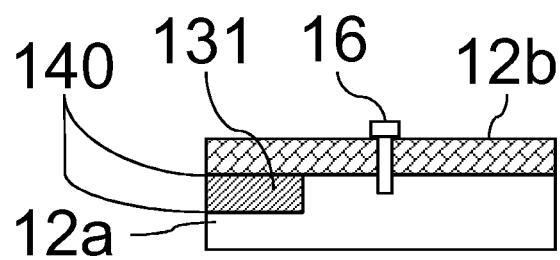
FIG. 3(a) is a schematic cross-sectional view of the clamping mechanism of the circuit board finger in the LED retrofit lamp of FIG. 1a during a stage of clamping.
Figure 3B:
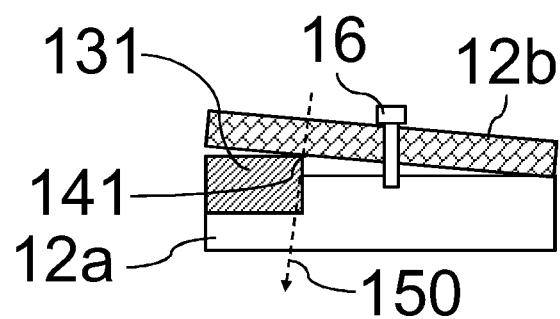
FIG. 3(b) is a schematic cross-sectional view of the clamping mechanism of the circuit board finger in the LED retrofit lamp of FIG. 1a during another stage of clamping.
Figure 3C:
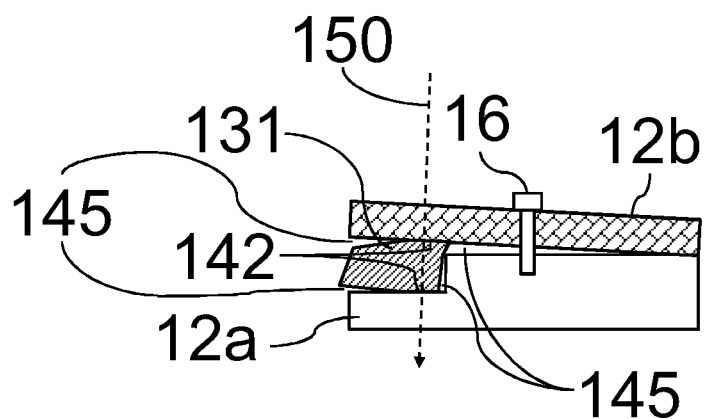
FIG. 3(c) is a schematic cross-sectional view of the clamping mechanism of the circuit board finger in the LED retrofit lamp of FIG. 1a during another stage of clamping, showing potential deformation of the finger.

FIG. 3(a), FIG. 3(b), and FIG. 3(c) are schematic cross-sectional views of the clamping mechanism of the circuit board finger in the LED retrofit lamp of FIG. 1a during different stages of clamping, showing potential deformation of the finger in FIG. 3(c). In FIG. 3(a), an ideal situation is shown where a screw 16 fixes the upper part 12b of the lamp body 12 onto the lower part 12a of the lamp body 12, thereby clamping the finger 131 over full planar contact areas 140 with just sufficient pressure to avoid movement, such as from ribbon bonding. In FIG. 3(b), a more realistic situation is depicted. In order to guarantee a firm clamping, the finger 131 needs to be in safe contact with the lower and upper parts 12a, 12b. In view of production tolerances, here, the nominal thickness of the finger 131 may be chosen larger than the height (i.e., the clear width) of the duct 124. Alternatively, or in addition, one could, for example, equip the upper part 12b with a flat protruding part at the contact area with the finger 131 (described in more detail below).

On turning in screw 16, the upper part 12b may assume an inclined position and may touch the finger 131 only at its upper right edge 141, yielding a line contact there, and exerting a clamping force 150 oblique to the upper surface of the finger 131. Turning screw 16 further in may squeeze the finger 131 starting from its upper right edge 141. As the finger 131 may typically be made of plastics whereas the lower and upper parts 12a, 12b of the lamp body 12 may be mainly formed from metal, the finger 131 may be more easily deformable than lamp body 12 and mechanical stress built up in the finger 131 may eventually start the finger 131 turning, dislocating and deforming. FIG. 3(c) shows schematically a possible final shape and position of the finger 131 after the screw 16 has been fully turned in (indicating with reference sign 145 voids created by the imperfect clamping).

The final contact area 142 of the finger 131 with the lower and upper parts 12a, 12b may still imperfect. While in extreme circumstances the finger 131 may even break, in less severe situations, the imperfect fixation, movement, turning, and deformation of the finger 131 may lead to subsequent issues. For example, the fixation of the part of finger 131 exposed in the lateral opening 122 may not be firm enough for ribbon bonding (on connecting ribbon bonds 14 to contact pads 132); or the position and angular orientation of the contact pads 132 may be that far from their nominal values that ribbon bonding may not be possible at all or may only yield a compromised connection. All in all, quality and lifetime of finger 131 and/or of the connection of ribbon bonds 14 and, thus, quality and maintenance of LED retrofit lamp 1 may be affected.

For at least partly alleviating these issues, besides a first finger 131 carrying contact pads 132, a second finger 131a may be included in the circuit board that extends from the body part 135 and parallel to the first finger 131 resulting in two longitudinal fingers 131, 131a symmetrically extending from the body part 135.

Figure 4:
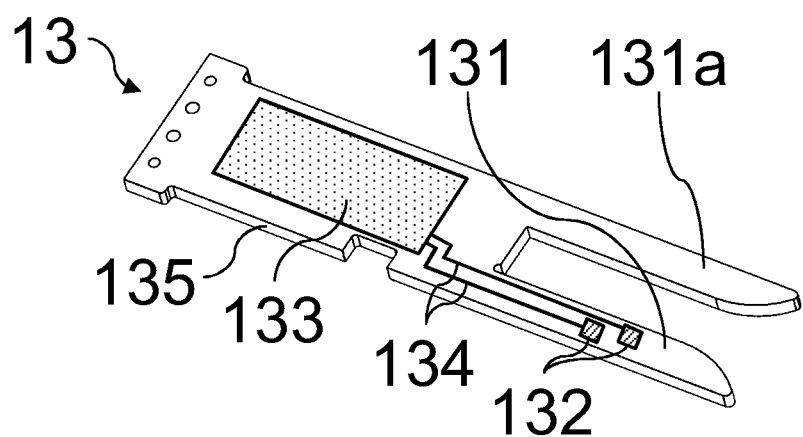
FIG. 4 is a schematic perspective view of an example circuit board with two longitudinal fingers.

FIG. 4 is a schematic perspective view of an example circuit board with two longitudinal fingers. In the example illustrated in FIG. 4, the finger 131 carries contact pads 132 for connection via ribbon bonds 14 to LED module 11 of LED retrofit lamp 1. Electrically conductive traces 134 on the finger 131 may electrically couple the contact pads 132 to the driver circuit 133 on the body part 135. The parallel finger 131a, here, may no electrical function. Adding finger 131a parallel to finger 131 may create, for the mechanical clamping of fingers 131, 131a between lower and upper parts 12a, 12b of lamp body 12, a symmetric situation.

Figure 5:
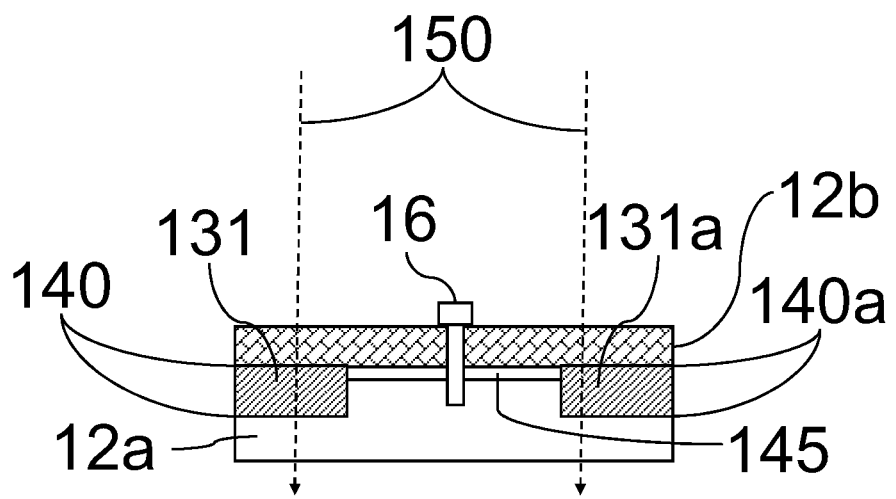
FIG. 5 shows is a schematic cross-sectional view of the clamping mechanism of the circuit board of FIG. 4.

FIG. 5 shows is a schematic cross-sectional view of the clamping mechanism of the circuit board of FIG. 4 and shows how, using two parallel fingers, clamping forces 150 may now apply symmetrically to both fingers 131, 131a, yielding nearly ideal planar contact areas 140, 140a between fingers 131, 131a and lower and upper part 12a, 12b. With clamping forces 150 now transversal to the upper surfaces of fingers 131, 131a, there may be no force components dislocating or twisting the fingers. The fingers may maintain their shape and position, and turning in screw 16 may yield a firm and durable fixation of fingers 131, 131a, strong enough to withstand the mechanical forces occurring on ribbon bonding ribbon bonds 14 to contact pads 132 on finger 131.

Figure 6:
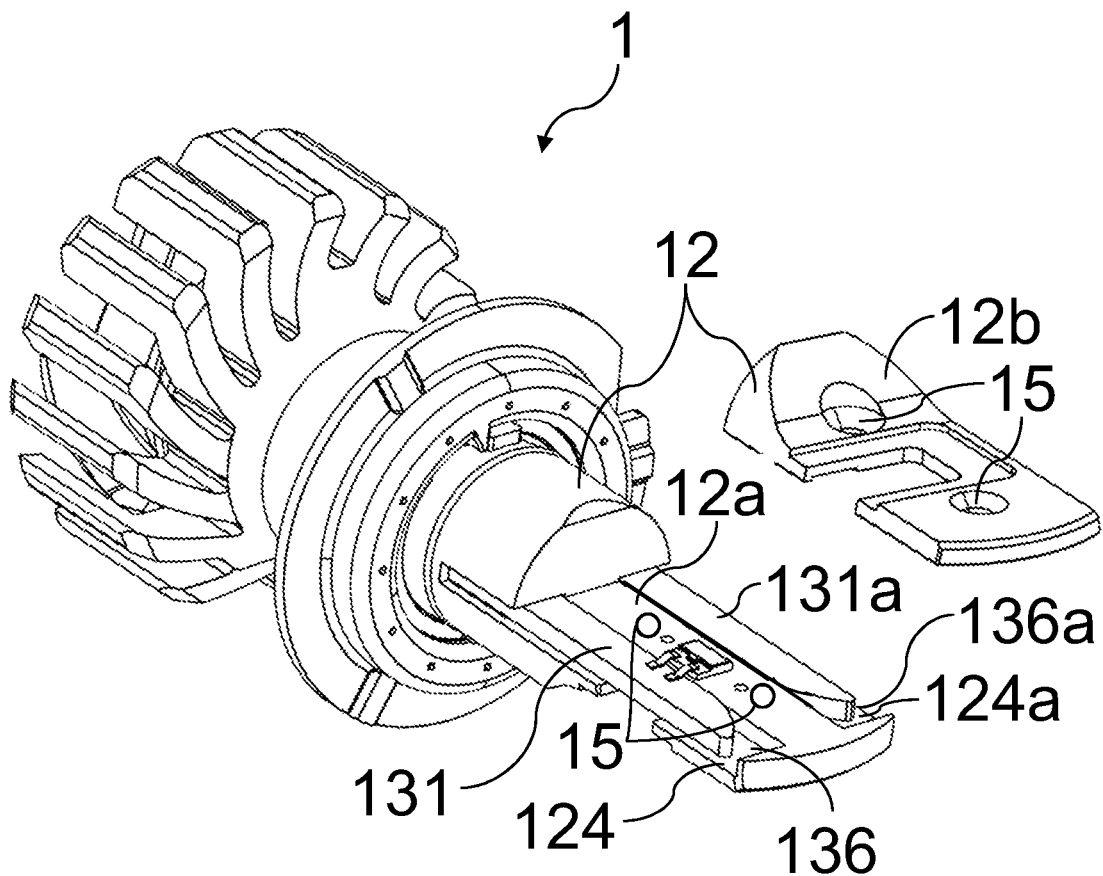
FIG. 6 is a schematic perspective view of an LED retrofit lamp for the circuit board of FIG. 4.
Figure 7A:
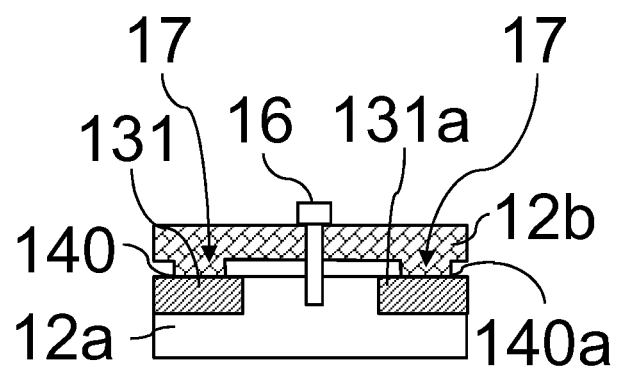
FIG. 7(a) is a schematic cross-sectional view of a further example of the clamping mechanism of the circuit board of FIG. 4.
Figure 7B:
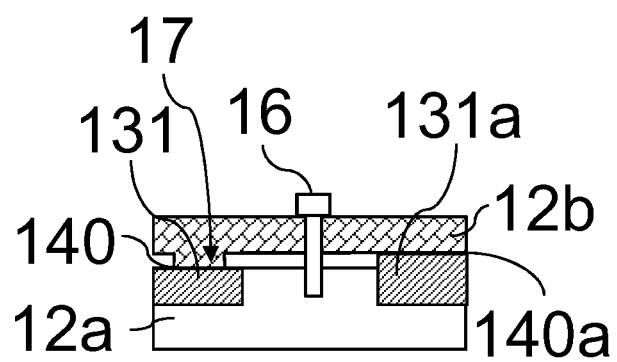
FIG. 7(b) is a schematic cross-sectional view of another example of the clamping mechanism of the circuit board of FIG. 4.
Figure 7C:
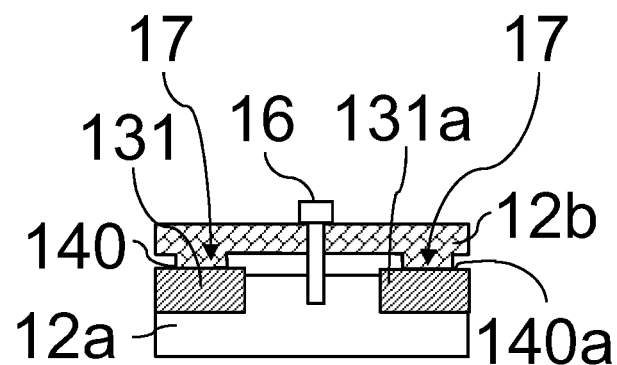
FIG. 7(c) is a schematic cross-section view of another example of the clamping mechanism of the circuit board of FIG. 4.
Figure 7D:
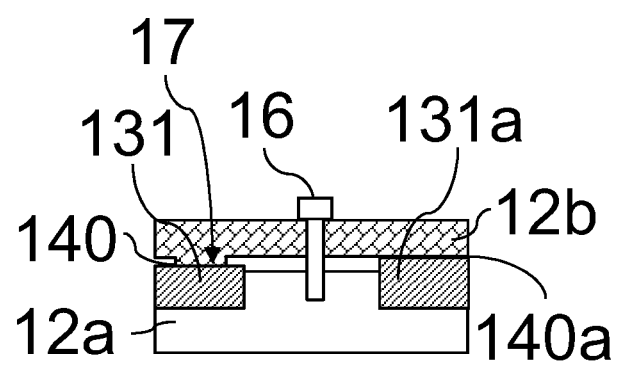
FIG. 7(d) is a schematic cross-section view of another example of the clamping mechanism of the circuit board of FIG. 4.

FIG. 6 is a schematic perspective view of an LED retrofit lamp 1 for the circuit board of FIG. 4. In contrast to FIG. 2, in FIG. 6, lamp body 12 has ducts 124, 124a on both sides, which may be realized as recesses 136, 136a in lower part 12a of lamp body 12. Fingers 131, 131a may be inserted from the base side of the LED retrofit 1 into these ducts 124, 124a. In this example, upper part 12b of lamp body 12 and fixation through screw holes 15 has not been modified.

FIG. 7(a), FIG. 7(b), FIG. 7(c) and FIG. 7(d) show schematic cross-sectional views of further examples of the clamping mechanism of the circuit board of FIG. 4. In FIG. 5, upper part 12b of lamp body 12 has a planar lower surface and firm clamping of fingers 131, 131a may be obtained by choosing the nominal thickness of the fingers slightly larger than the height of the ducts 124, 124a. Then, even under manufacturing tolerances, the lower surface of upper part 12b may safely touch the upper surfaces of fingers 131, 131a and exert a firm clamping after turning in screw 16 while possibly leaving a void 145 between the directly facing surfaces of lower and upper parts 12a, 12b. The illustration in FIG. 5 is schematic only, and may strongly over-emphasize the thickness difference.

Besides or alternative to thickening the fingers 131, 131a, the lower surface of upper part 12b may be equipped with protrusions 17 facing one of both of the fingers. FIG. 7(a), FIG. 7(b), FIG. 7(c) and FIG. 7(d) show some possible embodiments where thickening of fingers 131, 131a and protrusions 17 may also be combined.

Attachment of the upper part 12b to the lower part 12a of the lamp body 12, providing the clamping of fingers 131, 131a, as described, may be performed by one or more screws 16. However, any other attachment method providing the required clamping force may be substituted instead. Such as riveting or brackets. Gluing may be used if such is applied on pressuring while the glue hardens.

An LED retrofit lamp according to the embodiments described herein may be particularly useful within a vehicle light, such as for replacing a halogen lamp, such as one of an H1, H4, H7, H8, H9, H11, H13, H15, H17, H18, H19, 9002, 9003, 9004, 9005, 9006, or 9007 lamp. The embodiments described herein may encompasses such vehicle light, and, for example, a vehicle headlight providing a vehicle headlight beam, such as a low or a high beam.

Figure 8:
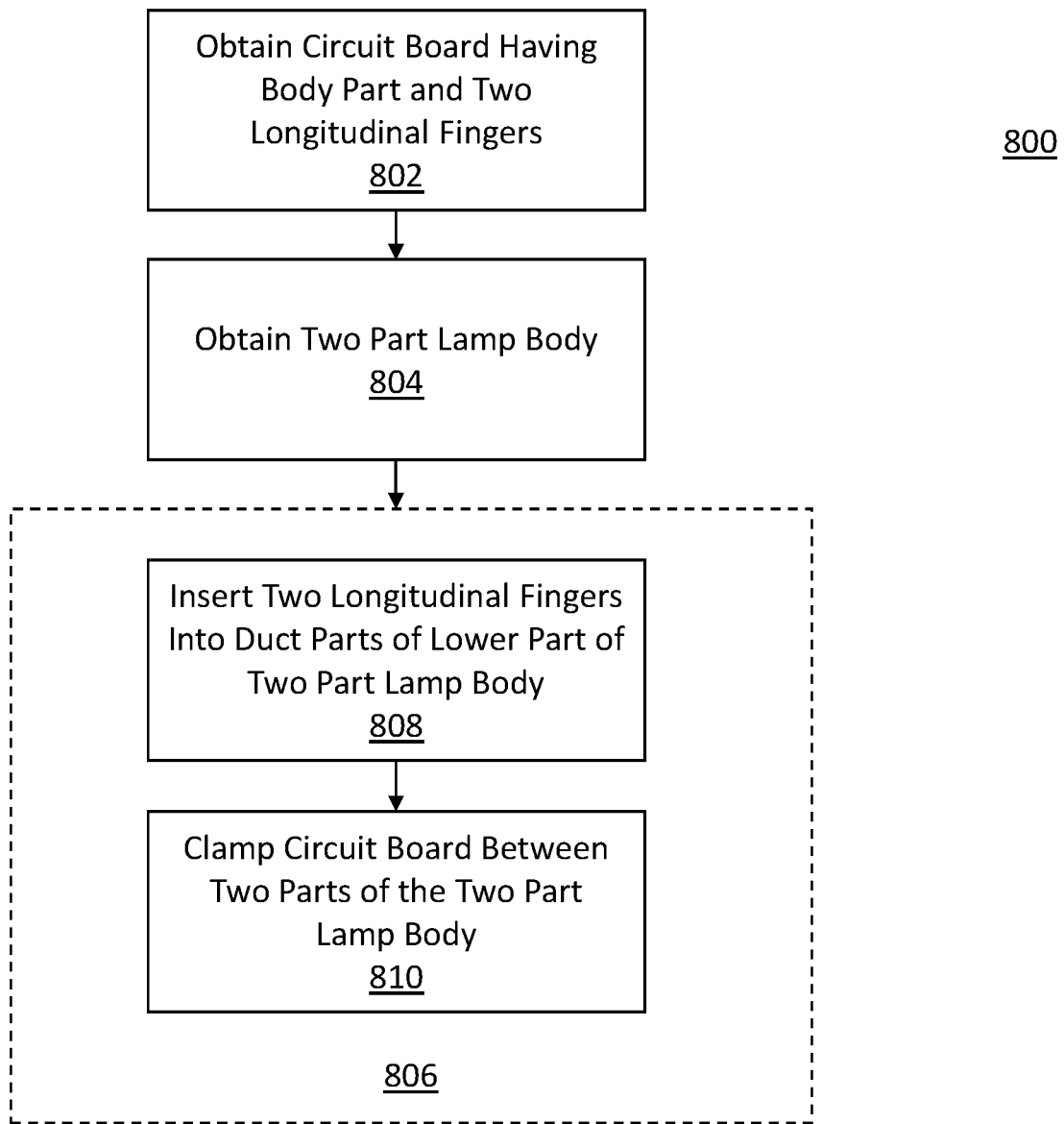
FIG. 8 is a flow diagram of an example method of manufacturing an LED retrofit lamp.

FIG. 8 is a flow diagram of an example method 800 of manufacturing an LED retrofit lamp. In the example illustrated in FIG. 8, a circuit board may be obtained (802). The circuit board may include a body part and two longitudinal fingers. The two longitudinal fingers may symmetrically extend from the body part in a longitudinal direction of the LED retrofit lamp. A lamp body may also be obtained (804). The lamp body may be a two part lamp body that includes an upper part and a lower part. The lower part may include a bore comprising duct parts. The circuit board may be mounted to the lamp body (806). Such mounting may include inserting the two longitudinal fingers into the duct parts of the lower part (808) and clamping the circuit board between the lower part and the upper part of the lamp body (810). Thereby the circuit board may be mounted to the lamp body without either of the two longitudinal fingers being mechanically distorted thereby.

An LED module may be mounted on the lower part of the lamp body, and the LED module may be ribbon bonded to contact pads on one of the two longitudinal fingers of the circuit board. Driver circuitry may be mounted on the body part of the circuit board. Electrical traces may be formed on the one of the two longitudinal fingers between the bond pads and the driver circuitry. The clamping may be performed, for example, by one of screwing, riveting, bracketing or gluing.

Figure 9:
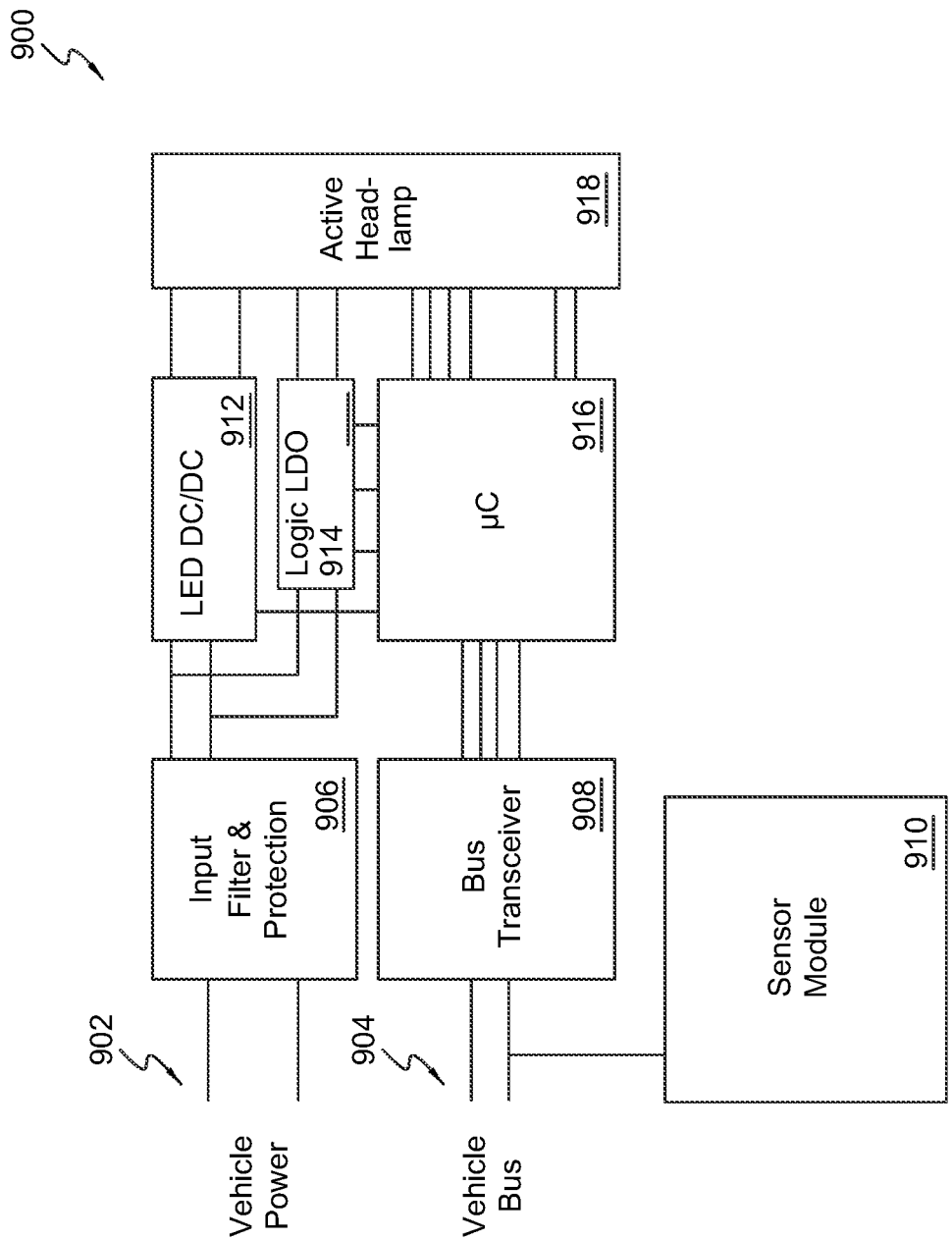
FIG. 9 is a diagram of an example vehicle headlamp system.

FIG. 9 is a diagram of an example vehicle headlamp system 900 that may incorporate one or more of the embodiments and examples described herein. The example vehicle headlamp system 900 illustrated in FIG. 9 includes power lines 902, a data bus 904, an input filter and protection module 906, a bus transceiver 908, a sensor module 910, an LED direct current to direct current (DC/DC) module 912, a logic low-dropout (LDO) module 914, a micro-controller 916 and an active head lamp 918.

The power lines 902 may have inputs that receive power from a vehicle, and the data bus 904 may have inputs/outputs over which data may be exchanged between the vehicle and the vehicle headlamp system 900. For example, the vehicle headlamp system 900 may receive instructions from other locations in the vehicle, such as instructions to turn on turn signaling or turn on headlamps, and may send feedback to other locations in the vehicle if desired. The sensor module 910 may be communicatively coupled to the data bus 904 and may provide additional data to the vehicle headlamp system 900 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 900. In FIG. 9, the headlamp controller may be a micro-controller, such as micro-controller (pc) 916. The micro-controller 916 may be communicatively coupled to the data bus 904.

The input filter and protection module 906 may be electrically coupled to the power lines 902 and may, for example, support various filters to reduce conducted emissions and provide power immunity. Additionally, the input filter and protection module 906 may provide electrostatic discharge (ESD) protection, load-dump protection, alternator field decay protection, and/or reverse polarity protection.

The LED DC/DC module 912 may be coupled between the input filter and protection module 906 and the active headlamp 918 to receive filtered power and provide a drive current to power LEDs in the LED array in the active headlamp 918. The LED DC/DC module 912 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 914 may be coupled to the input filter and protection module 906 to receive the filtered power. The logic LDO module 914 may also be coupled to the micro-controller 916 and the active headlamp 918 to provide power to the micro-controller 916 and/or electronics in the active headlamp 918, such as CMOS logic.

The bus transceiver 908 may have, for example, a universal asynchronous receiver transmitter (UART) or serial peripheral interface (SPI) interface and may be coupled to the micro-controller 916. The micro-controller 916 may translate vehicle input based on, or including, data from the sensor module 910. The translated vehicle input may include a video signal that is transferrable to an image buffer in the active headlamp 918. In addition, the micro-controller 916 may load default image frames and test for open/short pixels during startup. In embodiments, an SPI interface may load an image buffer in CMOS. Image frames may be full frame, differential or partial frames. Other features of micro-controller 916 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 10:
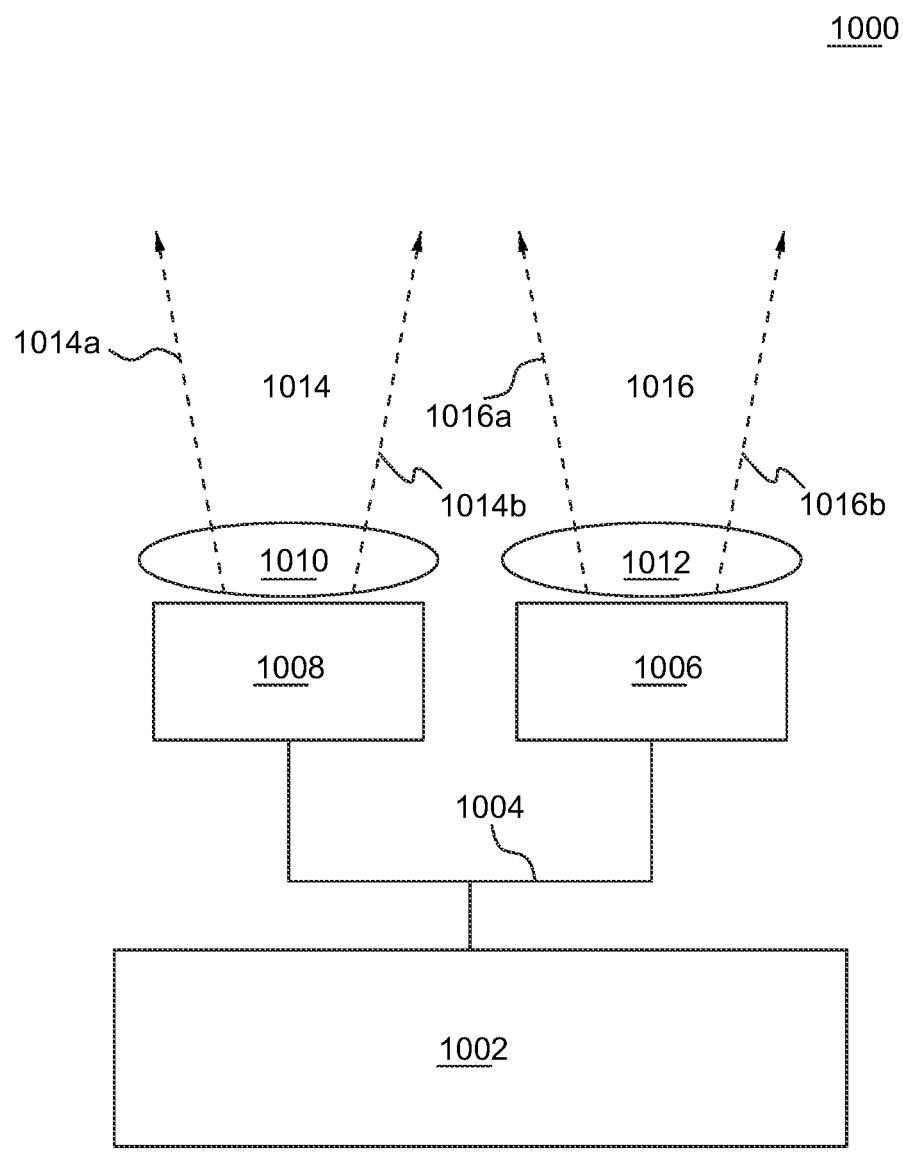
FIG. 10 is a diagram of another example vehicle headlamp system.

FIG. 10 is a diagram of another example vehicle headlamp system 1000. The example vehicle headlamp system 1000 illustrated in FIG. 10 includes an application platform 1002, two LED lighting systems 1006 and 1008, and secondary optics 1010 and 1012.

The LED lighting system 1008 may emit light beams 1014 (shown between arrows 1014a and 1014b in FIG. 10). The LED lighting system 1006 may emit light beams 1016 (shown between arrows 1016a and 1016b in FIG. 10). In the embodiment shown in FIG. 10, a secondary optic 1010 is adjacent the LED lighting system 1008, and the light emitted from the LED lighting system 1008 passes through the secondary optic 1010. Similarly, a secondary optic 1012 is adjacent the LED lighting system 1006, and the light emitted from the LED lighting system 1006 passes through the secondary optic 1012. In alternative embodiments, no secondary optics 1010/1012 are provided in the vehicle headlamp system.

Where included, the secondary optics 1010/1012 may be or include one or more light guides. The one or more light guides may be edge lit or may have an interior opening that defines an interior edge of the light guide. LED lighting systems 1008 and 1006 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 1008 and 1006 in a desired manner, such as, for example, with a gradient, a chamfered distribution, a narrow distribution, a wide distribution, or an angular distribution.

The application platform 1002 may provide power and/or data to the LED lighting systems 1006 and/or 1008 via lines 1004, which may include one or more or a portion of the power lines 902 and the data bus 904 of FIG. 9. One or more sensors (which may be the sensors in the vehicle headlamp system 1000 or other additional sensors) may be internal or external to the housing of the application platform 1002. Alternatively, or in addition, as shown in the example vehicle headlamp system 900 of FIG. 9, each LED lighting system 1008 and 1006 may include its own sensor module, connectivity and control module, power module, and/or LED array.

In embodiments, the vehicle headlamp system 1000 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 1006 and 1008 may be sensors (e.g., similar to sensors in the sensor module 910 of FIG. 9) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A circuit board for a light-emitting diode (LED) retrofit lamp for a vehicle light, the circuit board comprising:
   a body part comprising a driver section configured for mounting a driver circuit thereon; and
   two longitudinal fingers symmetrically extending from the body part in a longitudinal direction of the LED retrofit lamp, a first one of the two longitudinal fingers being configured for mounting two electrical contact pads thereon and electrically conductive traces electrically coupled between the two electrical contact pads and the driver section.

2. The circuit board according to claim 1, wherein a second one of the two longitudinal fingers has no electrical function.

3. A light-emitting diode (LED) retrofit lamp comprising:
   a circuit board comprising:
      a body part, and
      two longitudinal fingers symmetrically extending from the body part in a longitudinal direction of the LED retrofit lamp;
      contact pads on a first one of the two longitudinal fingers;
   a lamp body comprising an upper part and a lower part, the lower part comprising a bore comprising duct parts, the circuit board being mechanically coupled to the lower part of the lamp body with the two longitudinal fingers of the circuit board disposed at least partially in the duct parts in the lower part of the lamp body;
   an LED module on the lower part of the lamp body; and
   respective ribbon bonds electrically coupled between the LED module and the contact pads.

4. The LED retrofit lamp according to claim 3, wherein the two longitudinal fingers are symmetrically clamped between the lower part and the upper part of the lamp body.

5. The LED retrofit lamp according to claim 4, wherein the two longitudinal fingers are symmetrically clamped between the lower part and the upper part of the lamp body via one of screws, rivets, brackets or glue.

6. The LED retrofit lamp according to claim 4, wherein at least one of the fingers has a thickness larger than a clear width of the duct parts into which the at least one of the two longitudinal fingers is inserted.

7. The LED retrofit lamp according to claim 3, wherein a second one of the two longitudinal fingers has no electrical function.

8. The LED retrofit lamp according to claim 3, wherein the upper part of the lamp body further comprises a protrusion projecting outward from a part of a surface of the upper part directly facing one of the two longitudinal fingers.

9. The LED retrofit lamp according to claim 3, further comprising:
    a driver on the body part of the circuit board; and
    electrical traces electrically coupled between the contact pads on the first one of the two longitudinal fingers and the driver on the body part of the circuit board.

10. The LED retrofit lamp according to claim 3, wherein the LED retrofit lamp is configured for insertion into a vehicle light as a replacement for a halogen lamp.

11. The LED retrofit lamp according to claim 10, wherein the halogen lamp is one of an H1, H4, H7, H8, H9, H11, H13, H15, H17, H18, H19, 9002, 9003, 9004, 9005, 9006, or 9007 lamp.

12. A method of manufacturing a light-emitting diode (LED) retrofit lamp, the method comprising:
    obtaining a circuit board that comprises a body part and two longitudinal fingers symmetrically extending from the body part in a longitudinal direction of the LED retrofit lamp;
    obtaining a lamp body that comprises an upper part and a lower part, the lower part comprising a bore comprising duct parts;
    mounting the circuit board to the lamp body by:
        inserting the two longitudinal fingers into the duct parts of the lower part, and
        clamping the circuit board between the lower part and the upper part of the lamp body;
    mounting an LED module on the lower part of the lamp body; and
    ribbon bonding the LED module to contact pads on one of the two longitudinal fingers of the circuit board.

13. The method of claim 12, wherein neither of the two longitudinal fingers is mechanically distorted via the clamping.

14. The method of claim 12, further comprising mounting driver circuitry on the body part of the circuit board.

15. The method of claim 14, further comprising forming electrical traces on the one of the two longitudinal fingers between the bond pads and the driver circuitry.

16. The method of claim 12, wherein the clamping comprises one of screwing, riveting, bracketing or gluing.

* * * * *